United States Patent
Maekawa et al.

(10) Patent No.: US 6,989,681 B2
(45) Date of Patent: Jan. 24, 2006

(54) SOCKET FOR TESTING A SEMICONDUCTOR DEVICE AND A CONNECTING SHEET USED FOR THE SAME

(75) Inventors: Shigeki Maekawa, Tokyo (JP); Yoshihiro Kashiba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 79 days.

(21) Appl. No.: 10/659,281

(22) Filed: Sep. 11, 2003

(65) Prior Publication Data

US 2004/0046581 A1 Mar. 11, 2004

Related U.S. Application Data

(63) Continuation of application No. 09/686,981, filed on Oct. 17, 2000, now abandoned.

(30) Foreign Application Priority Data

Oct. 18, 1999 (JP) ............................................. 11-294677

(51) Int. Cl.
*G01R 31/02* (2006.01)

(52) U.S. Cl. ...................................... 324/755; 324/754
(58) Field of Classification Search ......... 324/754–765; 438/14–18, 666; 439/64–74; 257/621, 698
See application file for complete search history.

(56) References Cited

U.S. PATENT DOCUMENTS

| | | | |
|---|---|---|---|
| 4,954,878 A | 9/1990 | Fox et al. | |
| 5,163,834 A * | 11/1992 | Chapin et al. | 439/66 |
| 5,475,317 A | 12/1995 | Smith | |
| 5,691,041 A | 11/1997 | Frankeny et al. | |
| 5,892,245 A | 4/1999 | Hilton | |
| 5,984,691 A * | 11/1999 | Brodsky et al. | 439/66 |
| 6,069,481 A | 5/2000 | Matsumura | |
| 6,107,109 A * | 8/2000 | Akram et al. | 438/15 |
| 6,126,456 A * | 10/2000 | Campbell et al. | 439/74 |
| 6,373,273 B2 * | 4/2002 | Akram et al. | 324/765 |
| 6,620,731 B1 * | 9/2003 | Farnworth et al. | 438/667 |

FOREIGN PATENT DOCUMENTS

| | | |
|---|---|---|
| JP | 10-208835 | 8/1998 |
| JP | 2000-91048 | 3/2000 |

* cited by examiner

*Primary Examiner*—Vinh P. Nguyen
(74) *Attorney, Agent, or Firm*—Burns, Doane, Swecker & Mathis, L.L.P.

(57) ABSTRACT

Probes 1 for testing and outer connecting terminals 14a are electrically connected to a test socket for semiconductor devices. In use of a connecting sheet, fabricated by an elastically deformative insulating member and electrodes 202, flexibility is given, and good electrical contacts are obtainable. Further, because the connecting sheet 2 is exchangeable, contacting capability is recovered by exchange when solder debris is adhered and deposited to increase contact resistances. Accordingly, even though there is scattering of the heights of the outer connecting terminals, good electrical contact with the probes is obtainable, and even though the solder debris of the outer connecting terminals is adhered and deposited as a result of repeated usage, tests can be continuously conducted, wherein the test socket for semiconductor devices has good maintenance capability.

12 Claims, 18 Drawing Sheets

| 2: | CONNECTING SHEET | 110: | SOCKET BASE |
| 100: | PLUNGER | 110a: | SOCKET LID |
| 101: | CYLINDER | 110b: | ALIGNING PIN |
| 102: | COIL SPRING | 201: | CONNECTING HOLE |
| 103: | TERMINAL PORTION | 202: | ELECTRODE PAD |

202a, 202b: ELECTRODE PAD
203: CONNECTING WIRE

100b: SLIT

204: PROJECTION-LIKE ELECTRODE

100b: SLIT

205: RECESS-LIKE ELECTRODE

202a~d: ELECTRODE PAD

16a: ELECTRODE PAD

206: CONNECTING WIRE

207: CONNECTING TERMINAL

4: PROTRUSION
5: RECESS

14b: OXIDE COATING

4a: METALLIC PARTICLE
4b: PLATING LAYER

3: GUIDING PLATE

6: LEAD

6: LEAD
6a: BENDING PORTION
6b: SPACED PORTION

7: THROUGH HOLE

| 1: | PROBE | 13: | SEAT |
| --- | --- | --- | --- |
| 1a: | TIP PORTION | 14: | SEMICONDUCTOR PACKAGE |
| 1b: | CONNECTING TERMINAL | 14a: | OUTER CONNECTING TERMINAL |
| 11: | HOUSING | 15: | SOCKET |
| 12: | SECURING JIG | | |

18: DIRECTION ALIGNING ELECTRODE

16: CIRCUIT BOARD
17: CONNECTING PIN

100: PLUNGER
100a: PLUNGER TIP
101: CYLINDER
102: COIL SPRING

21: FLOATING PLATE
24: TWISTED LEAD PLATE
25: CONTACTING PART
25a: RECTANGULAR LEAD HOLE
25b: CONTACTING PART HAVING TAPER-LIKE INNER PERIPHERY

30: SOLDER DEBRIS
30a: OXIDE COATING

US 6,989,681 B2

SOCKET FOR TESTING A SEMICONDUCTOR DEVICE AND A CONNECTING SHEET USED FOR THE SAME

This application is a continuation of application Ser. No. 09/686,981, filed on Oct. 17, 2000 now abandoned.

BACKGROUND OF THE INVENTION

1. Field of the Invention

The present invention relates to a test socket used for testing electrical characteristics of semiconductor devices.

2. Discussion of Background

In accordance with advancement of functions and miniaturization of electronic equipments, the number of outer connecting terminals of semiconductor devices are increased, a density of semiconductor device becomes high, and semiconductor packages such as a ball grid array (BGA) type, which is formed by arranging outer connecting terminals on a lower surface of a semiconductor device in a grid-like form, and a chip scale package (CSP) type are increasingly used instead of a QFP type formed by arranging outwardly drawn-out connecting terminals, or an SOP type semiconductor package. When such a semiconductor package is delivered, electrical performance tests of the semiconductor device are conducted, wherein a tests socket, served as an interface connecting a tester, e.g. a computer, for conducting the performance tests to outer connecting terminals of the semiconductor device, is required.

FIG. 13 illustrates an example of a conventional test socket for testing a QFP type semiconductor package or an SOP type semiconductor package, formed by outwardly drawing out connecting terminals, wherein probes 1, formed by punching out an elastic member to have a predetermined shape, and a housing 11 for holding and fixing the probes 1 fabricate the test socket. In order to test, a semiconductor package 14 is supported by a seat 13, tips of the probes 1 are in contact with outer connecting terminals 14a, such as a lead, drawn out of the semiconductor package 14, and a securing jig 12 pushes the outer connecting terminals 14a toward the tips, whereby the outer connecting terminals 14a are electrically connected with the probes 1, and a predetermined test signal is transmitted to and received from an electric circuit of the semiconductor device, located inside the semiconductor package 14 through the probes 1 and the outer connecting terminals 14a.

In this test socket, the probes 1, being in contact with the outer connecting terminals 14a, are arranged on four sides or two sides in a periphery of the semiconductor package 14. The probes 1 are formed to have a bent shape, for example, a U-shape, and have tip portions 1a, being in contact with the outer connecting terminals at ends thereof and connecting terminals 1b connected to the tester and located in a housing at the other ends, wherein when the outer connecting terminals 14a are pressed to the tip portions 1a, a part of the U shape is bent and contacting force is obtained by counterforce from the part.

Further, FIGS. 14a and 14b respectively are a cross-sectional view of a CSP type semiconductor package, formed by arranging outer connecting terminals 14a on a back surface of a semiconductor device in a grid like form, and a plan view, viewed from the back surface. The outer connecting terminals 14a and aligning electrodes 18 are arranged on the back surface of the semiconductor device 14 in a grid-like form. Accordingly, it is difficult to arrange the probes 1 of the conventional test socket. Therefore, a test socket having pin-like probes 1, for example, illustrated in FIG. 15, is also used for a CSP type semiconductor package. In the figure, numerical reference 1 designates a probe; numerical reference 11 designates a housing; numerical reference 14 designates a semiconductor package; numerical reference 14a designates an outer connecting terminal; numerical reference 15 designates a socket; numerical reference 16 designates a circuit board; and numerical reference 17 designates a connecting pin for connecting with a testing equipment. In thus constructed test socket, the probes 1 formed like a pin, named Pogopin, is provided. Therefore, it is possible to arrange the probes 1 in correspondence with a large number of outer connecting terminals 14a, formed on a lower surface of a semiconductor device, so that a density of the probes 1 is high.

Because the density of the pin-like probes 1 used in the test socket is high, and the outer connecting terminals cannot have elasticity, which is achieved by bending to have a U-shape as in the probes 1 of the test socket for QFP type semiconductor packages and so on, which packages are arranged so that their outer connecting terminals are outwardly drawn out, a structure, for example illustrated in FIG. 16, is adopted to apply pressure. In FIG. 16, numerical reference 101 designates a cylinder for guiding a tip 100a of a plunger, in contact with outer connecting terminals 14a of a semiconductor package, and the plunger 100 to enable reciprocal motion; and numerical reference 102 designates a coil spring for securing a contact pressure and a stroke of the plunger. The tip 100a of the plunger is in contact with an outer connecting terminal 14a such as a solder ball. In order to increase a contact area, there is a case that the tip is shaped like a recess. The pin-like probe 1 works such that the plunger 100 is backwardly moved by a contact along with pressure between the tip 10a of the plunger and the outer connecting terminal 14a, e.g. a solder ball, of the semiconductor package 14, the contact pressure is obtained by counterforce of the coil spring 102, and simultaneously, the tip 100a of the plunger breaks an oxide coating, formed on a surface of the outer connecting terminal, so as to be in contact with a new metallic surface inside the outer connecting terminal, whereby an electric connection is obtainable.

Further, FIGS. 17a and 17b are cross-sectional views of a probe for a conventional test socket for another CSP type semiconductor package, disclosed in Japanese Unexamined Patent Publication JP-A-7-272810. The test socket has a floating plate 21, constantly pushed in an upward direction by a spring (not shown), whereby when a semiconductor package 14 is installed and pushed, the floating plate 21 is downwardly moved. The probe 1 is shaped like a pin, and a twisted lead plate 24 is located in addition to a contacting part 25, being in contact with the outer connecting terminal 14a. As illustrated in the figures, when the outer connecting terminal 14a further pushes the contacting part 25 from a state that the outer connecting terminal 14a is in contact with a contacting surface 25b having a taper-like inner periphery of the contacting part 25, a rectangular lead hole 25a of the contacting part 25 is guided by a piece 24a of the twisted lead plate 24 and applied with a rotating force in a direction of an angle of the twisted lead plate. Accordingly, the contacting surface 25b having a taper-like inner periphery 25b is kept to be in contact with the outer connecting terminal 14a, and the outer connecting terminal 14a is slid on and rubbed with the contacting surface 25b by the rotating force while keeping the contacting surface 25b having a taper-like inner periphery in contact with the outer connecting terminal 14a, whereby an oxide coating is destroyed and dust is expelled, whereby electrical connection is obtainable without spoiling the outer connecting terminal 14*a*.

However, the probe 1, pressing the tip 100*a* of the plunger by the cylinder, made large scars to the outer connecting terminals 14*a*, e.g. solder balls, of the semiconductor package. Therefore, a void is caused at time of mounting the outer connecting terminals to a printed circuit board and so on by melting the outer connecting terminals in use of reflow of solder, whereby a defect of blowhole is caused.

Further, as illustrated in FIG. 18, when remains 30 of solder adheres to and are deposited on a tip of a probe, the remains are oxidized in the atmosphere, and a contact resistance is increased by a coating of an oxide film 30*a*, there were problems that a semiconductor device could not be tested, and a function of the socket could not be demonstrated.

Further, the probe having a rotating mechanism, disclosed in the above-mentioned Japanese Unexamined Patent Publication JP-A-7-272810, easily produced an alloy, and the alloy was welded because large shear force is applied when the probe is in contact with the new surface of the solder, and a temperature of the contacting surface is locally increased. Further, there were problems that a contact resistance was increased by the coating of the oxide film, the semiconductor device could not be tested, and a function of the socket could not be demonstrated.

Further, it was necessary to spend a very long time and much labor for exchanging probes, selected as having high contact resistances or connection failures out of a large number, e.g. several hundreds, of the pin-like probes arranged in a grid-like form. There was a problem that a cost becomes very high when a socket itself was changed because a unit price of the above-mentioned pin-like probe is high.

SUMMARY OF THE INVENTION

It is an object of the present invention to solve the above-mentioned problems inherent in the conventional technique and to provide a test socket for semiconductor devices, which can stably and continuously realize sufficient electric contact between probes and outer connecting terminals.

According to a first aspect of the present invention, there is provided a test socket for testing electric characteristics of a semiconductor device by making probes, arranged in a grid-like form, in contact with outer connecting terminals of the semiconductor device, arranged in a grid-like form to electrically connect the probes to the outer connecting terminals comprising:

a connecting sheet for electrically connecting the probes with the outer connecting terminals of the semiconductor device, a base of which connecting sheet is an elastically deformative insulating member;

electrodes being in contact with the probes and located in the elastically deformative insulating member; and electrodes being in contact with the outer connecting terminals of the semiconductor device and located in the elastically deformative insulating member, wherein the probes are electrically connected with the outer connecting terminals.

According to a second aspect of the present invention, there is provided the test socket according to the first aspect of the invention, further comprising:

electrically connecting holes formed in the elastically deformative insulating member of the connecting sheet in a grid-like form;

electrodes being in contact with the probes; and electrodes being in contact with the outer connecting terminals of the semiconductor device, wherein the electrodes being in contact with the probes are located on a surface opposite to the electrodes being in contact with the outer connecting terminals of the semiconductor device through the elastically deformative insulating member.

According to a third aspect of the present invention, there is provided the test socket according to the first aspect of the invention, wherein the electrodes being in contact with the probes of the connecting sheet of the test socket are shaped like a protrusion, which is engaged with a probe shaped like a recess, or a recess, which is engaged with a probe shaped like a projection.

According to a fourth aspect of the present invention, there is provided a test socket having a circuit board, which transmits and receives an electric signal for testing electric characteristics of a semiconductor device between the circuit board and outer connecting terminals of the semiconductor device arranged in a grid-like form and transmitting and receiving the electric signal between the circuit board and a testing equipment comprising:

a connecting seat for electrically connecting the circuit board to the outer connecting terminals of the semiconductor device, a base of which connecting sheet is an elastically deformative insulating member;

electrodes being in contact with the circuit board and located in the elastically deformative insulating member; and electrodes being in contact with the outer connecting terminals of the semiconductor device and located in the elastically deformative insulating member, wherein the circuit board is electrically connected with the outer connecting terminals.

According to a fifth aspect of the present invention, there is provided the test socket according to the fourth aspect of the invention, wherein the connecting sheet of the test socket has a connecting wire, which increases distances between the electrodes, being in contact with the outer connecting terminals of the semiconductor device, and is connected to the electrodes being in contact with the circuit board.

According to a sixth aspect of the present invention, there is provided the test socket according to any one of the first through fourth aspects of the invention, wherein the electrodes being in contact with the outer connecting terminals of the semiconductor device in the connecting sheet have a plurality of protrusions, formed by a smooth curved surface, and a plurality of recesses, formed by a smooth curved surface expanding in the vicinity of the protrusions.

According to a seventh aspect of the present invention, there is provided the test socket according to any one of the first through fourth aspects of the invention, further comprising:

a guiding member having holes at positions corresponding to the outer connecting terminals of the semiconductor device, wherein the guiding member overlaps the connecting sheet.

According to an eighth aspect of the present invention, there is provided the test socket according to any one of the first through fourth aspects of the invention, wherein the electrodes being in contact with the outer connecting terminals of the semiconductor device in the connecting sheet of the test socket have spaced portions and bent portions, and the bent portions are in contact with the outer connecting terminals of the semiconductor device.

According to a ninth aspect of the present invention, there is provided the test socket according to any one of the first through fourth aspects of the invention, wherein a through hole is formed in a part of the connecting sheet of the test socket.

According to a tenth aspect of the present invention, there is provided the first connecting sheet, which is included in the test socket according to any one of the first through fourth aspects of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein.

DETAILED DESCRIPTION OF THE PREFERRED EMBODIMENTS

A detailed explanation will be given of preferred embodiments of the present invention in reference to FIG. 1 through.12 as follows, wherein the same numerical references are used for the same or similar portions and descriptions of these portions is omitted.

Embodiment 1

Figure 1:
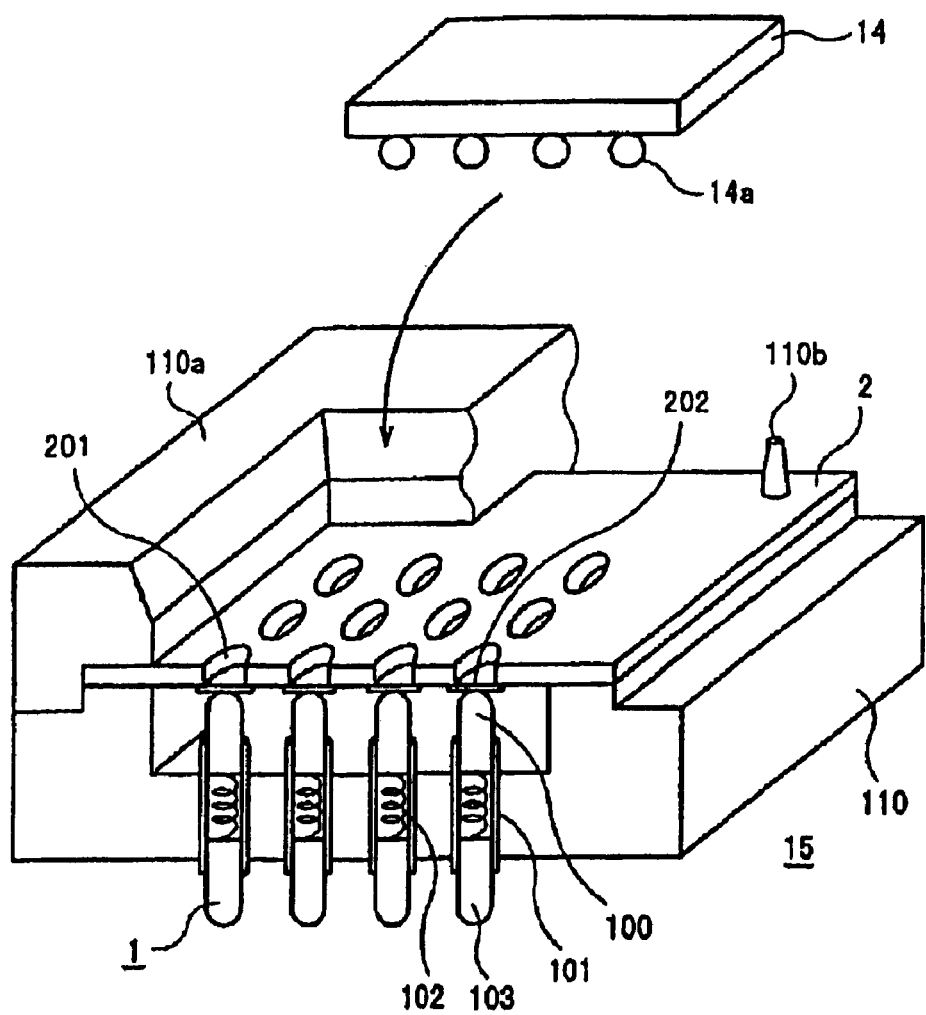
FIG. 1 is a perspective view of a test socket according to Embodiment 1 of the present invention.

FIG. 1 is a perspective view illustrating a structure of a test socket according to Embodiment 1 of the present invention. In the figure, numerical reference 1 designates a probe; numerical reference 2 designates a connecting sheet; numerical reference 201 designates a connecting hole; numerical reference 202 designates an electrode pad; numerical reference 100 designates a plunger; numerical reference 101 designates a cylinder; numerical reference 102 designates a coil spring; numerical reference 103 designates a terminal portion, connected to a test board; numerical reference 110 designates a socket base; numerical reference 110a designates a socket lid; numerical reference 110b designates an aligning pin; numerical reference 14 designates a semiconductor package; numerical reference 14a designates an outer connecting terminal; and numerical reference 15 designates a socket.

In this test socket, an elastically deformative insulating member is used as a base, and the connecting sheet 2 having the connecting holes 201 at positions corresponding to the outer connecting terminals 14a of the semiconductor package is located in the socket base using the aligning pin 110b. The electrode pads 202 are located on lower surfaces, being in contact with the probes 1, of the connecting holes 201 so as to be electrically connected with the probes 1. Accordingly, when the semiconductor package is mounted on the test socket and applied with pressure by a securing jig (not shown), the outer connecting terminals 14a of the semiconductor package are in contact with the electrodes pads 202 of the connecting sheet 2. Further, because the probes 1 are pushed by the force of the coil springs 102 so as to be in contact with the electrode pads 202, the outer connecting terminals 14a are electrically connected with the probes 1 through the connecting sheet 2, whereby a test signal from a testing equipment (not shown) is transmitted to and received by the semiconductor device.

When the semiconductor device is repeatedly tested in use of the test socket, although solder debris 30 on surfaces of the outer connecting terminals 14a is adhered to the electrode pads 202, by exchanging only the connecting sheet 2 when a contact resistance becomes large enough to disable the test, electrical contacting capability is recovered again. Meanwhile, because the electrodes pads 202 of the connecting sheet remain being in contact with the pin-like-probes 1, a coagulating matter is not produced by sliding motion or is not adhered and deposited. Accordingly, it is unnecessary to exchange the probes by selecting these and to exchange the entire socket of a high cost, whereby a maintenance cost can be drastically reduced. Further, the base of the connecting sheet is an elastically deformative insulating member, it is possible to deal with scattering of the heights of the outer connecting terminals by bending motion of the insulating member, whereby reliability is improved.

For example, the connecting sheet 2, used for the test socket, is fabricated by bonding or crimping copper foil having a thickness of about several dozens of $\mu$m on a resin film such as polyimide, polyethylene terephthalate, or the like, having a thickness of about several hundreds of $\mu$m and forming the electrode pads 202 at positions corresponding to the outer connecting terminals 14a in a grid-like shape by etching or the like. Subsequently, the connecting holes 201 are formed by removing the resin in use of, for example, a laser, e.g. a $CO_2$ laser, from surfaces opposite to the electrodes pads 202, whereby the connecting sheet is easily manufactured at a low cost.

Further, the amount of elastic deformation is about 30 through 70 μm in order to absorb the scattering the heights of the outer connecting terminals. The insulating members, which can absorb the scattering, is a resin substrate, such as epoxy and aramid, besides the above-mentioned resin film.

Further, the electrode pads on the connecting sheet 2 may be formed by etching a conductive plate, e.g. copper, beryllium copper, phosphor bronze after thermo-compression bonding the conductive plate to the base such as a resin film. By plating nickel or gold on the conductive plate, it is possible to keep strength and prevent oxidation, whereby a contact resistance is preferably stabilized.

Further, because the outer connecting terminals 14a are pressed so as to be in contact with the electrode pads 202, an example that a conductive layer is not formed especially on inner walls of the connecting holes 201 is described. However, in order to enhance reliability, a conductive layer may be formed, for example, by plating.

Embodiment 2

Figure 2:
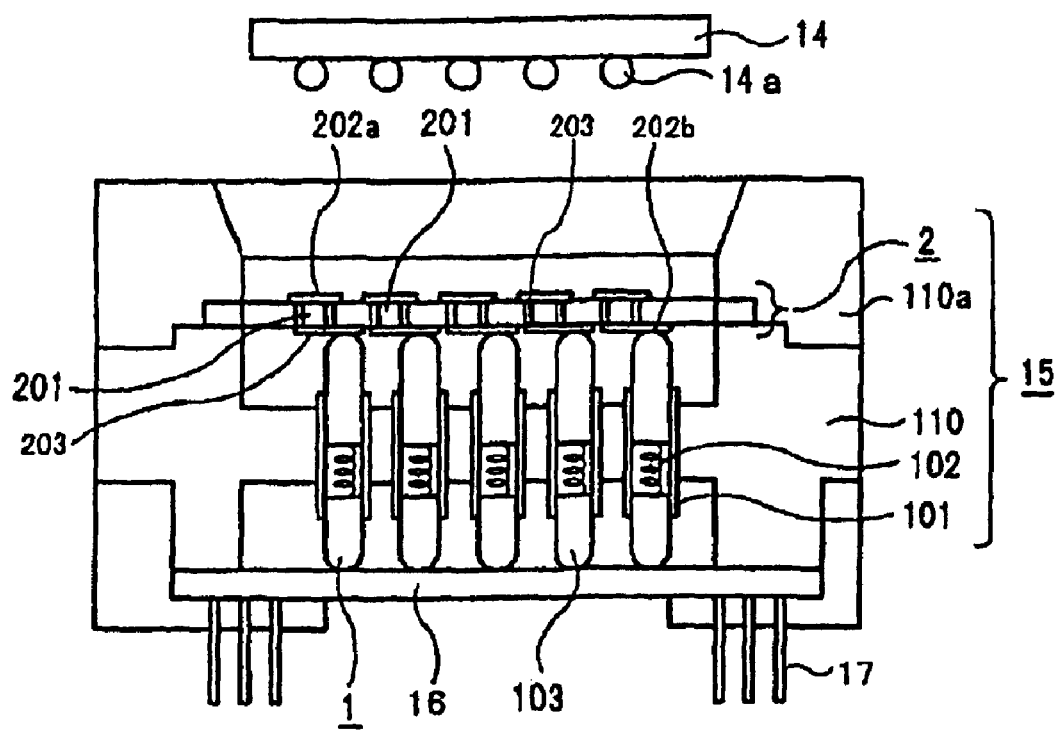
FIG. 2 is a cross-sectional view of a test socket according to Embodiment 2 of the present invention.

FIG. 2 is a cross-sectional view illustrating a structure of a test socket according to Embodiment 2 of the present invention. In the figure, numerical reference 1 designates a probe; numerical reference 2 designates a connecting sheet; numerical reference 201 designates a connecting hole; numerical references 202a and 202b designate electrode pads; numerical reference 203 designates a connecting wire; numerical reference 100 designates a plunger; numerical reference 101 designates a cylinder; numerical reference 102 designates a coil spring; numerical reference 103 designates a terminal portion; numerical reference 110 designates a socket base; numerical reference 110a designates a socket lid; numerical reference 14 designates a semiconductor package; numerical reference 14a designates an outer connecting terminal; numerical reference 15 designates a socket; numerical reference 16 designates a circuit board; and numerical reference 17 designates a connecting pin.

The connecting sheet, included in the test socket, has electrode pads 202a at positions corresponding to the outer connecting terminals 14a of a semiconductor device, and the electrodes pads 202a are connected with the electrodes pads 202b through the connecting wires 203 on walls of the connecting holes 201 and the connecting wires 203 on the connecting sheet 2. Accordingly, in a similar manner to that in Embodiment 1, the outer connecting terminals 14a are electrically connected with the probes 1 through the connecting sheets 2.

Accordingly, when a contact resistance is increased as a result of repeated usage, the contact resistance can be recovered by exchanging the connecting sheet 2. Further, in this embodiment, because the electrodes are located on both sides of the connecting sheet 2, it is possible to deal with the outer connecting terminals of any shape. Further, because positions of the electrode 202a and 202b can be changed by the connecting wires 203, it is possible to deal with modifications of arrangement and pitches of the outer connecting terminals 14a and the probes 1.

Embodiment 3

Figure 3:
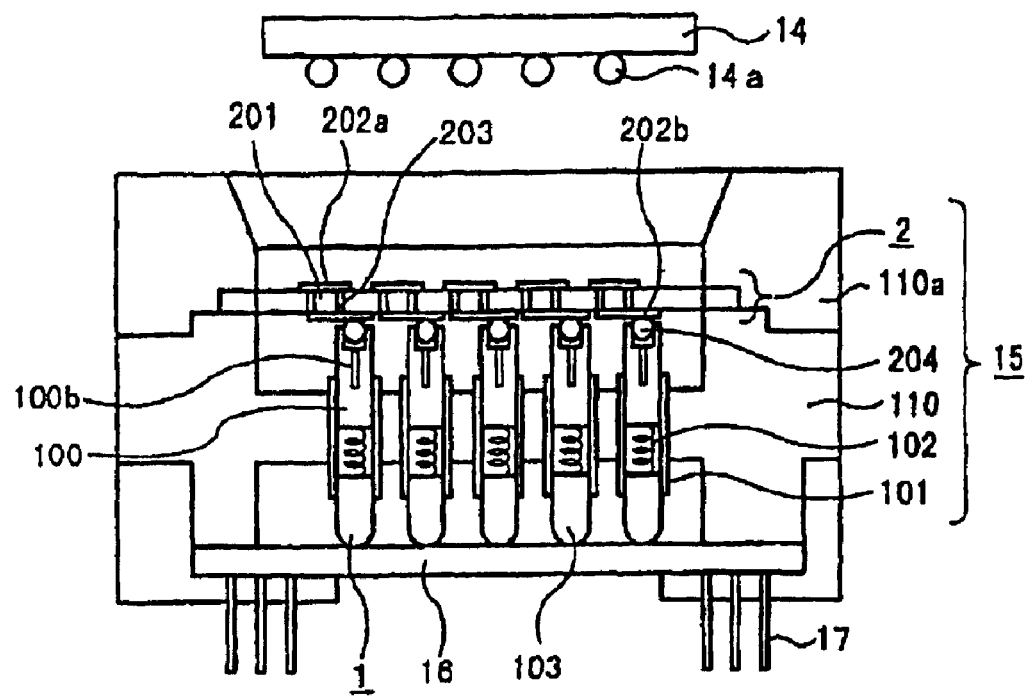
FIG. 3 is a cross-sectional view of a test socket according to Embodiment 3 of the present invention.

FIG. 3 is a cross-sectional view illustrating a structure of a test socket according to Embodiment 3 of the present invention. In the figure, numerical reference 1 designates a probe; numerical reference 2 designates a connecting sheet; numerical reference 201 designates a connecting hole; numerical references 202a and 202b designate electrode pads; numerical reference 203 designates a connecting wire; numerical reference 204 designates a protrusion-like electrode; numerical reference 100 designates a plunger; numerical reference 100b designates a slit; numerical reference 101 designates a cylinder; numerical reference 102 designates a coil spring; numerical reference 103 designates a terminal portion; numerical reference 110 designates a socket base; numerical reference 110a designates a socket lid; numerical reference 14 designates a semiconductor package; numerical reference 14a designates an outer connecting terminal; numerical reference 15 designates a socket; numerical reference 16 designates a circuit board; and numerical reference 17 designates a connecting pin.

In the connecting sheet included in the test socket, the electrode pads 202a are located at positions corresponding to the outer connecting terminals 14a of the semiconductor package, and the electrode pads 202a are connected to the electrode pads 202b through the connecting wires 203 on walls of the connecting holes 201. Accordingly, the outer connecting terminals 14a are electrically connected to the probes 1 via the connecting sheet 2 in a manner similar to those in Embodiment 1 and 2. When a contact resistance is increased as a result of repeated usage, it is possible to recover the contact resistance by exchanging the connecting sheet. Further, in this embodiment, the protrusion-like electrodes 204, such as solder balls, are formed in the electrode pads 202b so that the protrusion-like electrodes are engaged with recesses formed in tips of the plungers 100 of the probes 1 to obtain electric contacts with the plungers. Accordingly, in this socket, it is possible to obtain a secure contact between the probes 1 and the connecting sheet 2.

The protrusion-like electrodes 204 are preferably in elastical contact with the probes 1 so as to be easily detachable. Therefore, inner dimensions of the recesses, formed in the tips of the plungers of the probes 1 are made a little smaller than outer dimensions of the protrusion-like electrodes 204, and the slits 100b are formed, whereby the tips of the plungers are apt to elastically deform, are easily detached, and provide secure contacts.

Figure 4:
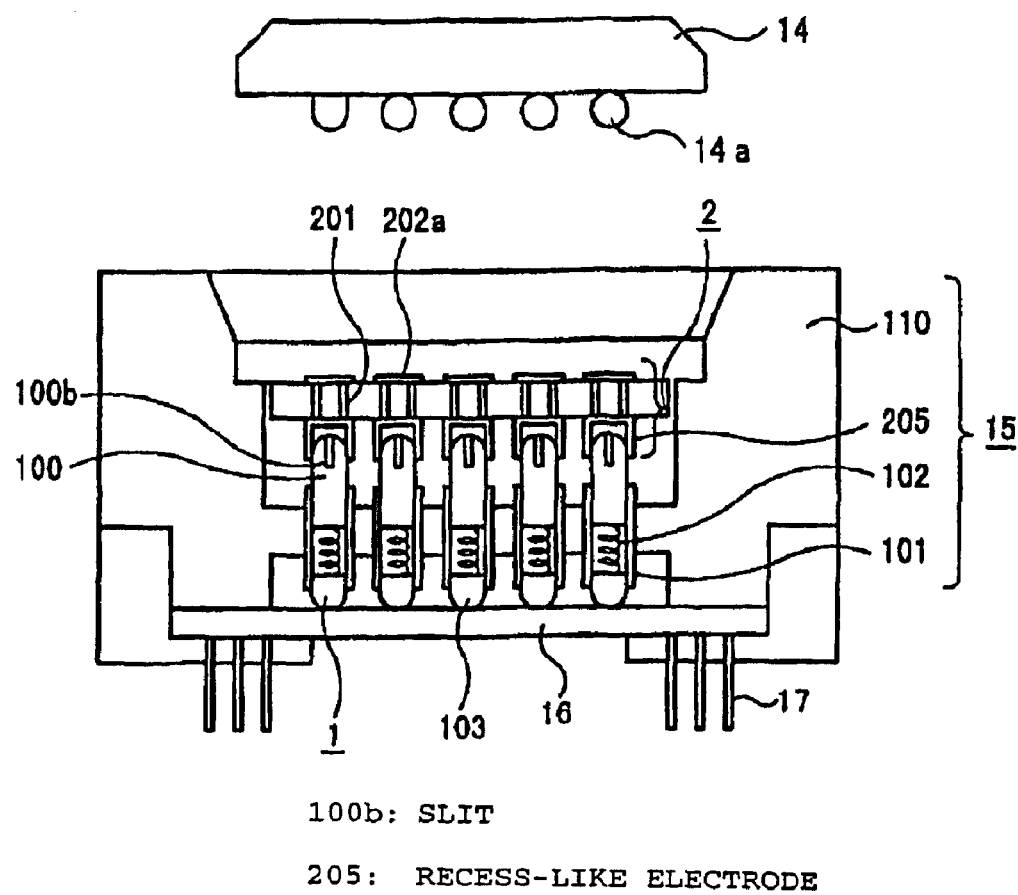
FIG. 4 is a cross-sectional view of a test socket according to Embodiment 3 of the present invention.

Further, FIG. 4 illustrates an example that recess-like electrodes 205 are formed on the connecting sheets 2 when tips of plungers 100 of a probe 1 are shaped like a protrusion, wherein the protrusion of the tips of the plungers 100 of the probe 1 are engaged with the recess-like electrodes 205 to provide secure contacts between the probes 1 and the connecting sheet 2. Meanwhile, as described above, by making outer dimensions of the tips of the plungers of the probe a little smaller than inner dimensions of the recess-like electrodes 205 and by forming slits 100b in the probes, the tips of the plungers are apt to elastically deform, are easily detached, and provide secure contacts.

The recess-like electrodes 205 are mounted in connecting holes 201 of the connecting sheet 2 or on electrodes pads 202b after forming electrode caps by deformation processing, for example, press working. The connecting sheet 2 may be formed by embedding the recess-like electrodes thereinto.

Further, by plating nickel on the above-mentioned protrusion-like electrodes 204 and the above-mentioned recess-like electrodes 205, strength can be kept. By is plating gold thereon, oxidation can be prevented, and a contact resistance is preferably stabilized.

Embodiment 4

Figure 5:
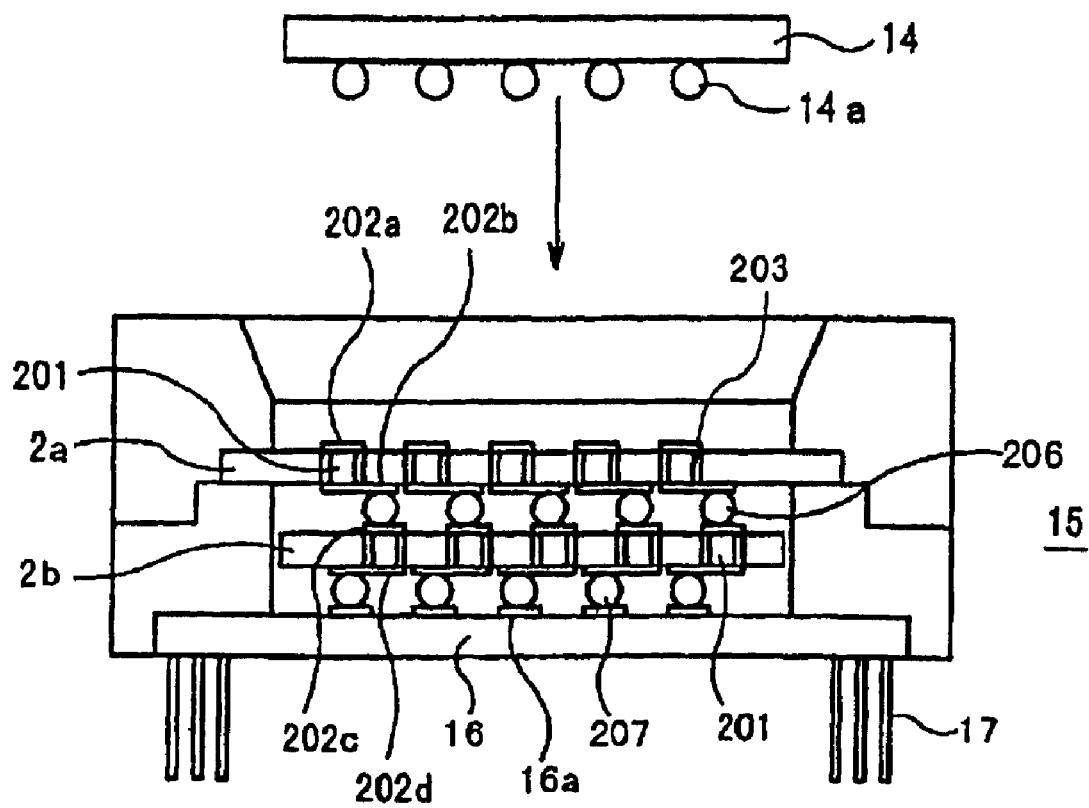
FIG. 5 is a cross-sectional view of a test socket according to Embodiment 4 of the present invention.

FIG. 5 is a cross-sectional view illustrating a structure of a test socket according to Embodiment 4 of the present invention. In the figure, numerical references 2a and 2b designate connecting sheets; numerical reference 201 designates a connecting hole; numerical references 202a, 202b, 202c and 202d designate electrode pads, formed on the connecting sheets; numerical reference 203 designates a connecting wire, formed in the connecting hole 201; numerical reference 206 designates a wire for connecting the connecting sheets; numerical reference 207 designates a connecting terminal; numerical reference 14 designates a semiconductor package; numerical reference 14a designates an outer connecting terminal; numerical reference 15 designates a socket; numerical reference 16 designates a circuit board; numerical reference 16a designates an electrode pad on the circuit board; and numerical reference 17 designates a connecting pin.

The number of seats of the connecting sheets included in the test socket is two. The electrode pads 202a are formed on the first connecting sheet 2a at positions corresponding to the outer connecting terminals 14a of the semiconductor package, and the electrode pads 202a are connected to the electrodes pads 202b via the connecting wires 203 on walls of the connecting holes 201. Further, ball-like connecting wires 206 are formed on the electrode pads 202b so as to be connected with the electrodes 202c on the second connecting sheet 2b and connected with the electrodes 202d via the connecting holes. The electrodes 202d have the ball-like connecting terminals 207 so as to be in contact with the electrodes 16a of the circuit board 16. By piling a plurality of connecting sheets, made of elastically deformative insulating members, flexibility becomes large, and follow-up capability with respect to scattering of the heights of the outer connecting terminals 14a of the semiconductor device is enhanced. Further, when the semiconductor package 14 is incorrectly set such that the semiconductor package 14 is obliquely mounted, capability of dealing with excessive pressure is enhanced. Thus, since elasticity is given without using a costly probe, a socket structure can be simplified, and a production cost can be reduced.

Meanwhile, in this embodiment, an example that the two layers of the connecting sheets are used is described. However, the number of layers is not limited as long as elasticity is given and alignment is possible.

Further, it is also possible to give a function of changing an electrode pitch to the connecting sheet 2 according to this embodiment. In this embodiment, by sequentially enlarging a wiring pitch in use of the two layers of the connecting sheets, a pitch of the electrode pads 202d of the second connecting sheet is made about 1.8 mm with respect to a pitch of about 0.8 mm of the outer connecting terminals 14a of the semiconductor device. The pitch of 1.8 mm is generally used for outer connecting terminals for BGA type packages. Generally used circuit boards 16 for BGA can be diverted to the circuit board 16. Further, the wiring pitch can be enlarged in use of the wires of the circuit board 16 so as to be connected with an existing testing equipment.

Embodiment 5

Figure 6:
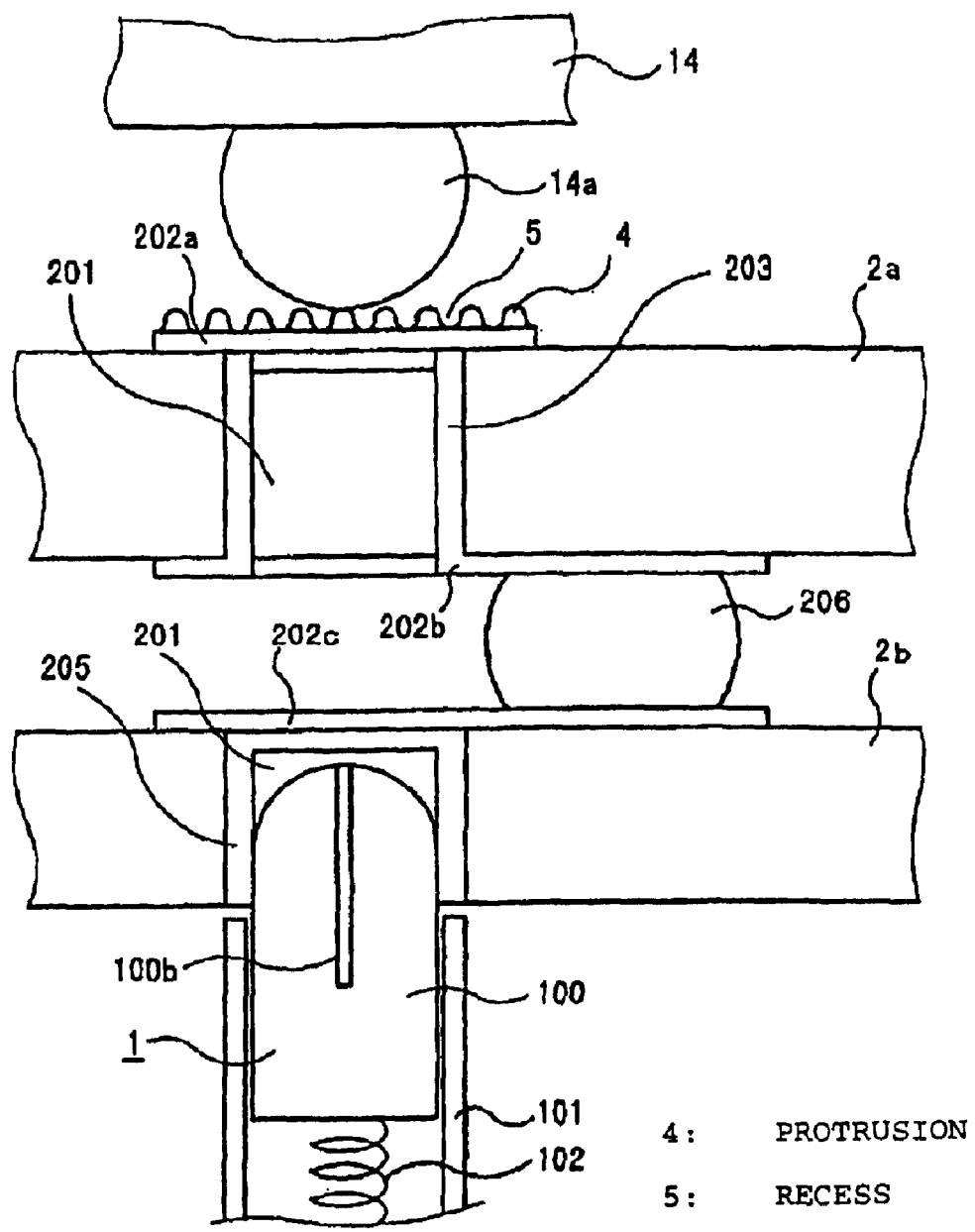
FIG. 6 is a cross-sectional view of a test socket according to Embodiment 5 of the present invention.
Figure 7:
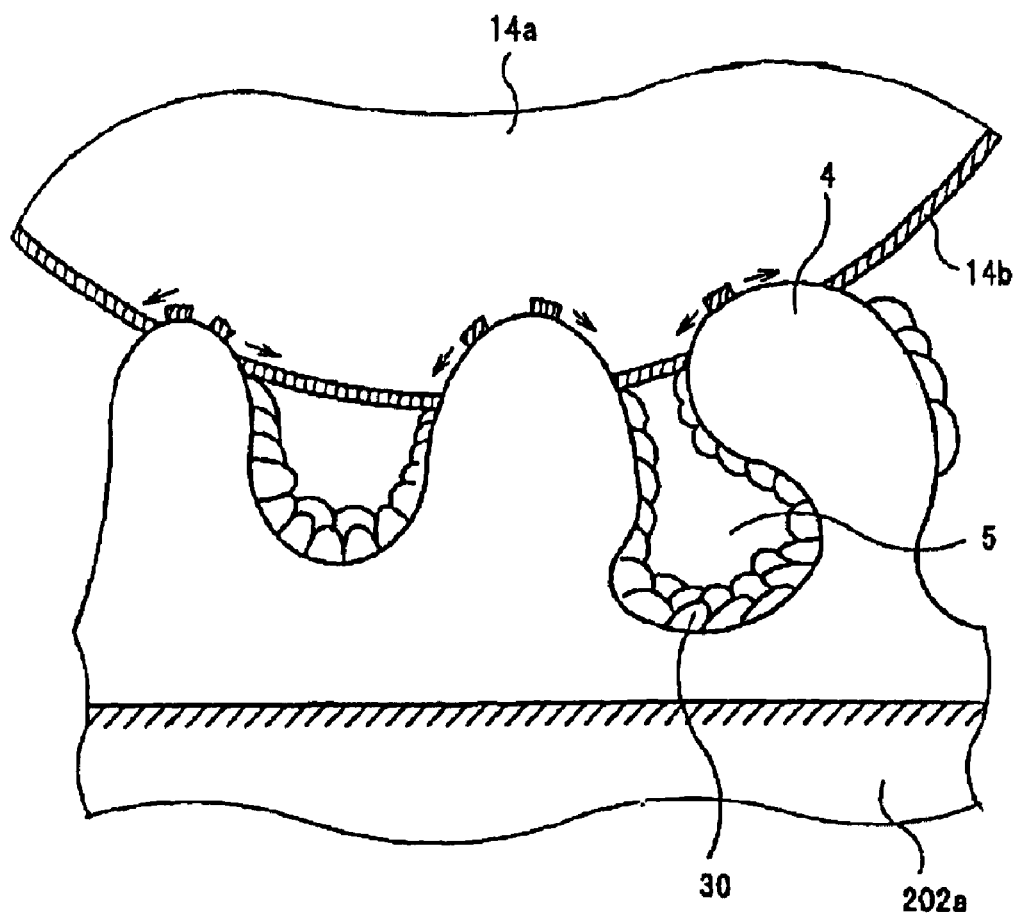
FIG. 7 is a cross-sectional view of a test socket according to Embodiment 5 of the present invention.

FIGS. 6 and 7 are cross-sectional views illustrating a structure of a test socket according to Embodiment 5 of the present invention. In the figures, numerical references 1 designates a probe; numerical reference 2a and 2b designate connecting sheets; numerical reference 4 designates a protrusion formed into a smooth curved surface; numerical reference 5 designates a recess formed into a smooth curved surface, the recess extending in the vicinity of the protrusion 4; numerical reference 201 designates a connecting hole; numerical references 202a, 202b and 202c designate electrode pads; numerical references 203 and 206 designate connecting wires; numerical reference 205 designates a recess-like electrode; numerical reference 100 designates a plunger; numerical reference 100b designates a slit; numerical reference 101 designates a cylinder; numerical reference 102 designates a coil spring; numerical reference 14 designates a semiconductor package; numerical reference 14a designates an outer connecting terminal; numerical reference 14b designates an oxide coating on a surface of the outer connecting terminal; and numerical reference 30 designates solder debris.

In this test socket, the electrodes pads 202a are formed on the connecting sheet 2a at positions corresponding to the outer connecting terminals 14a of the semiconductor device, and the electrodes pads 202a of the connecting sheet 2a are connected-to the recess-like electrodes 205 via the connecting wires 203, the electrode pads 202b, the connecting wires 206, and the electrodes pads 202c. Accordingly, in a similar manner to those in Embodiment 1 through 3, the outer connecting terminals 14a are electrically connected to the probes 1 via the connecting sheets. When a contact resistance is increased by repeated usage, the contact resistance can be recovered by exchanging the connecting sheets. Further, in this embodiment, because the minute protrusions 4, formed into the smooth curved surface, are formed on surfaces of the electrodes 202a, being in contact with the outer connecting terminals 14a of the semiconductor package, it is possible to obtain secure Contacts between the outer connecting terminals, 14a of the semiconductor device and the electrodes 202a, and to keep a good contact resistance. Further, because the minute recesses 5 formed into the smooth curved surface are formed in the vicinity of the protrusions 4, it is possible to accumulate the solder debris 30, which is produced by contact with the outer connecting terminals 14, whereby an increment of the contact resistance caused by intervention of the solder debris between the outer connecting terminals 14a and the electrodes 202a can be prevented.

Functions of the protrusions 4, formed into the smooth curved surfaces, and the recesses 5, formed into the smooth curved surfaces and extending in the vicinity of the protrusions 4, will be described in detail in reference of FIG. 7. In this socket, the outer connecting terminals 14a are in contact with the protrusions 4, formed into the smooth curved surfaces and formed on the electrode pads 202a by applying contact pressure, and the number of the protrusions 4 is plural. Therefore, a contact area is kept. Further, although the solder debris 30, made of solder existing in the outer connecting terminals 14a and oxide coating 14b formed on surfaces thereof, is produced a little, the solder debris 30 coagulates to and is deposited on the recesses 5, formed into the smooth curved surfaces and extending in the vicinity of the protrusions 4, whereby deposition on the protrusions 4 served for the electrical connection, can be prevented. Accordingly, it is possible to obtain a metallic contact by penetrating the oxide films on the outer connecting terminals without applying large sliding motion, required in the conventional socket, a stable contact resistance can be maintained for a long time, and a long lifetime of the connecting sheets 2 is obtainable.

Further, because it is unnecessary to apply a large pressure, required in the conventional socket, it is possible to prevent deformation of the outer connecting terminals 14a. Especially, since the pressure is small, thermal deformation of the outer connecting terminals, e.g. solder balls, caused at time of increasing a temperature, can be suppressed, whereby it is confirmed that burn-in test, which could not conducted in use of the conventional socket, can be performed.

Further, although adhesion and generation of solder on the protrusions 4 are unavoidable because the outer connecting terminals 4, e.g. solder, are plastically deformed, by continuing to push the outer connecting terminals again at events of contacts in the second time and the following times, a function of pushing out the solder debris 30 and bringing into the recesses 5, i.e. a cleaning function, is known. Further, although the deposited solder debris 30 buries the recesses 5, the solder debris plastically flows through adjacent recesses 5 and spreads, surfaces of the protrusions 4 can always be mechanically in contact with the outer connecting terminals.

A shape of the protrusions 4 is not specified in this embodiment. It is preferable to shape tips of the protrusions to have a curved surface, for example, a radius of curvature R is about 5 through 30 $\mu$m.

In order to form the protrusions 4, formed by the smooth curved surfaces, and the recesses 5, formed by the smooth curved surfaces and extending in the vicinity of the protrusions 4, for example, there is a method of fixing nickel particles having a particle diameter of about 5 through 30 $\mu$m to surfaces of the electrodes 202a by electro plating. Further, there is a method of making the surfaces of the electrode pads to have maximum surface roughness of about 5 through 30 $\mu$m using electric discharge machining, etching, shotblasting, or the like, and plating nickel having a thickness of about 3 through 25 $\mu$m.

Figure 8:
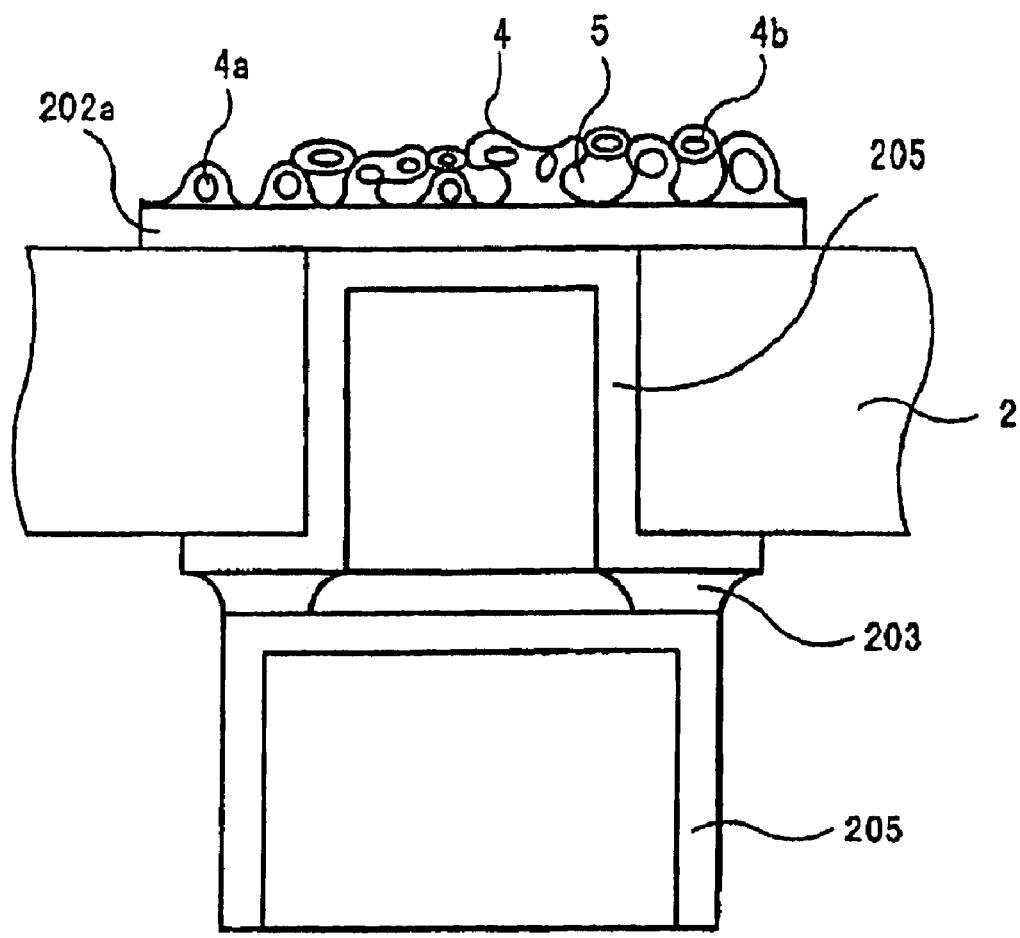
FIG. 8 is a cross-sectional view of a test socket according to Embodiment 5 of the present invention.

Further, as illustrated in FIG. 8, by securing metallic particles 4a by a plating layer 4b and realizing a multi-layer structure, it is possible to increase volumes inside the recesses 5 and further improve the function of accumulating the solder debris 30. Instead of the metallic particles 4a, it is possible to form cores of plating in insulative particles and fixing these by electroless plating.

Figure 14A:
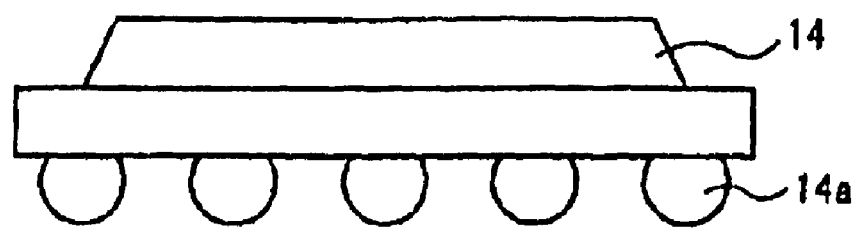
FIG. 14a is a cross-sectional view of a CSP type semiconductor package.
Figure 14B:
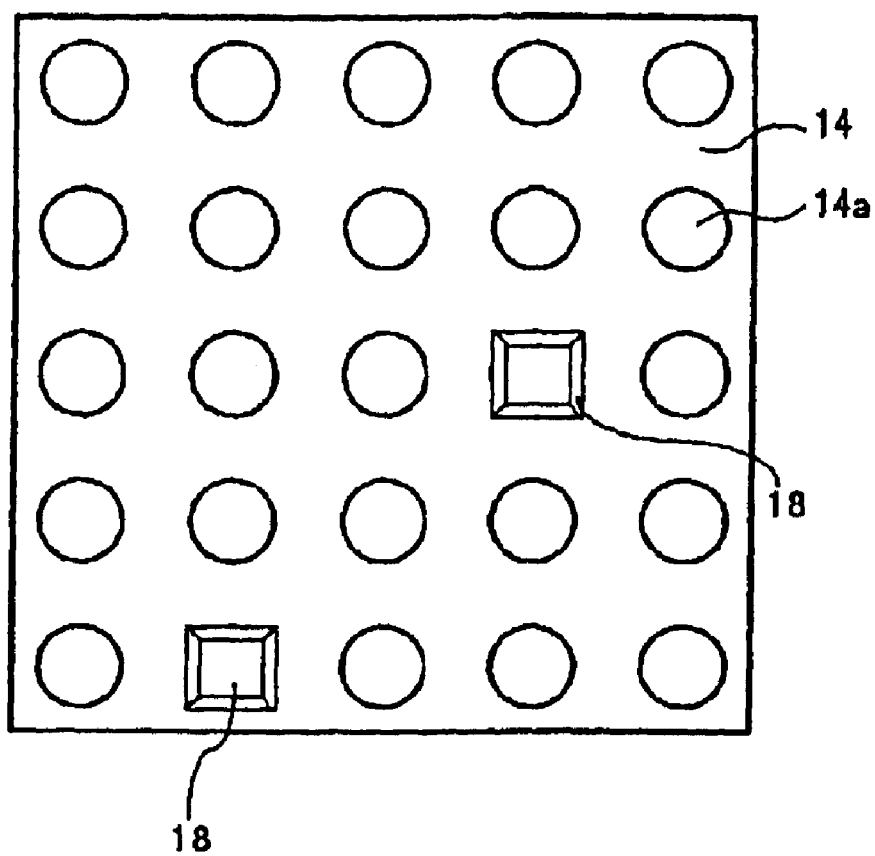
FIG. 14b is a plan view of the CSP type semiconductor package, viewed from a back surface thereof.
Figure 15:
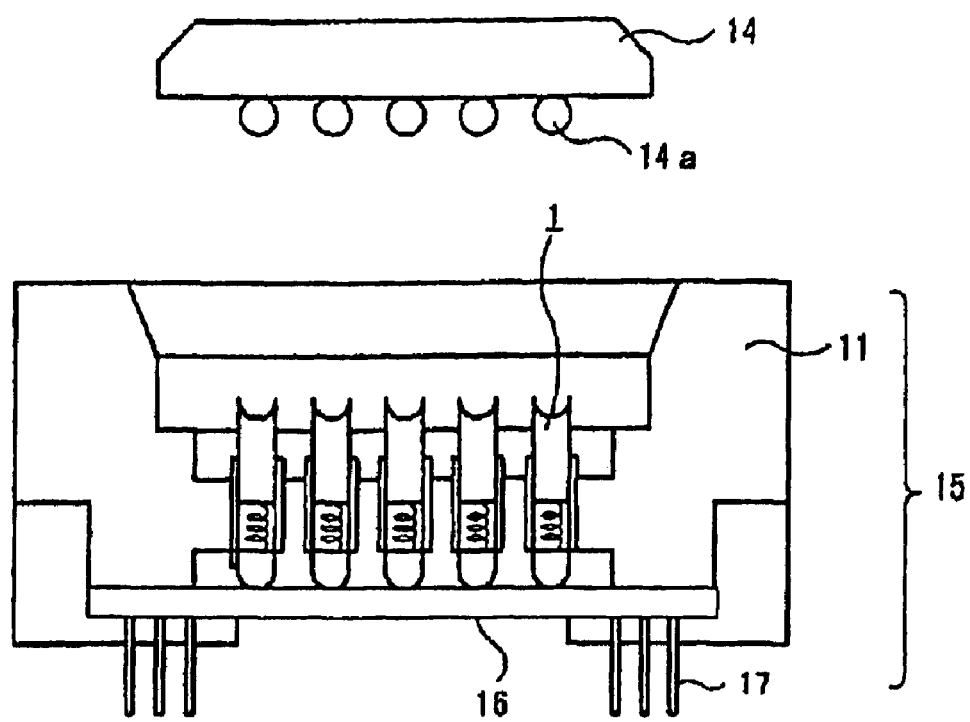
FIG. 15 is a cross-sectional view illustrating another conventional test socket.
Figure 16:
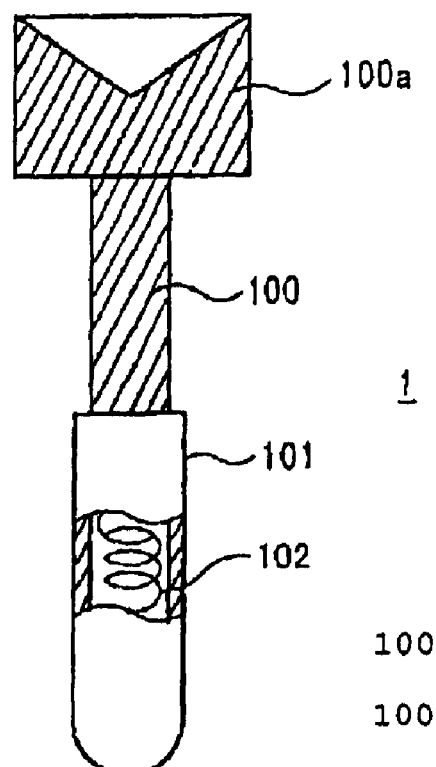
FIG. 16 is a cross-sectional view of a conventional pin-like probe.
Figure 17A:
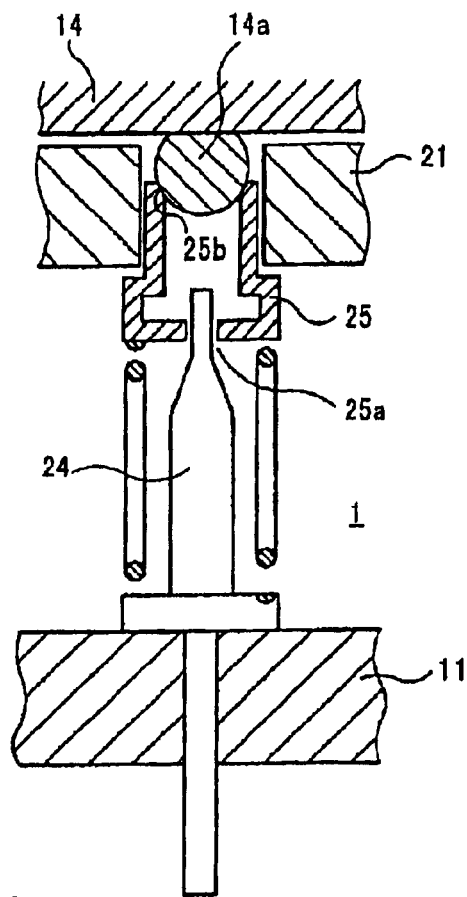
FIG. 17a is a cross-sectional view illustrating another conventional test socket.
Figure 17B:
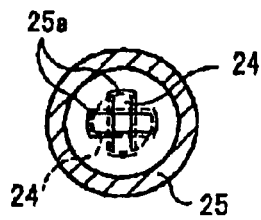
FIG. 17b is a cross-sectional view illustrating another conventional test socket.
Figure 18:
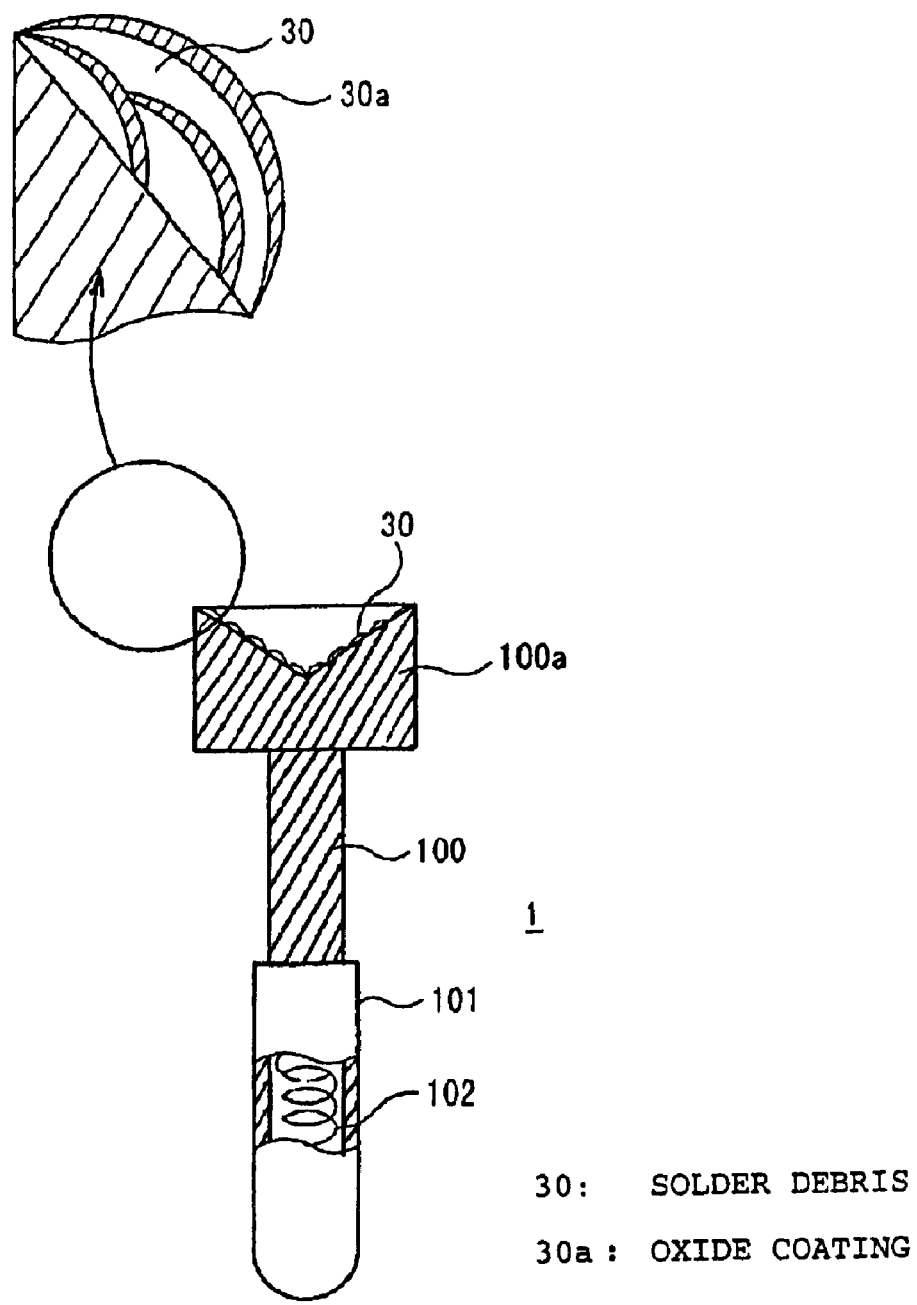
FIG. 18 is a cross-sectional view, schematically illustrating a conventional pin-like probe in a state that solder debris is adhered to and deposited on a tip of the pin-like probe.

The semiconductor device is tested in use of the test socket according to this embodiment. As a result, a good electrical contact resistance of about 50 through 200 m$\Omega$ is obtainable under a contact pressure of one-third of that in the conventional technique, wherein it is confirmed that a lifetime of ten times more than that in the conventional socket, illustrated in FIGS. 14a and 14b, is obtainable.

Embodiment 6

Figure 9:
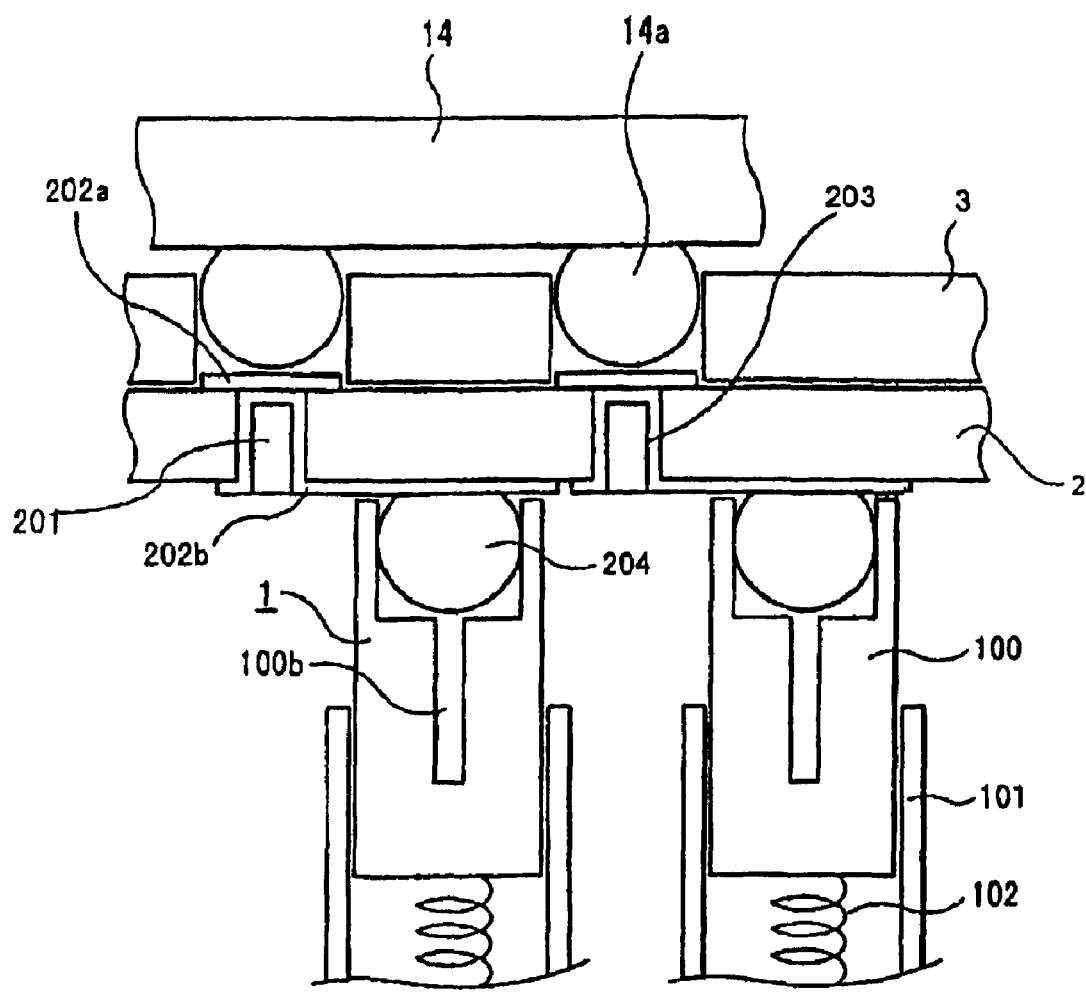
FIG. 9 is a cross-sectional view of a test socket according to Embodiment 6 of the present invention.

FIG. 9 is a cross-sectional view illustrating a structure of a test socket according to Embodiment 6 of the present invention. In the figures, numerical reference 1 designates a probe; numerical reference 2 designates a connecting sheets; numerical reference 3 designates a guiding plate; numerical reference 201 designates a connecting hole; numerical references 202a and 202b designate electrode pads; numerical references 204 designates a protrusion-like electrode; numerical reference 100 designates a plunger; numerical reference 101 designates a cylinder; numerical reference 102 designates a coil spring; numerical reference 14 designates a semiconductor package; and numerical reference 14a designates an outer connecting terminal.

In this test socket, the guiding plate 3 and the electrode pads 202a are located at positions corresponding to the outer connecting terminals 14a of the semiconductor device, and the outer connecting terminals 14a are connected to connecting wires 203 through the connecting holes 201, the connecting wires 203 is elongated, and the outer connecting terminals are connected to the electrode pads 202b. Accordingly, in a similar manner to those in Embodiments 1 through 5, when the outer connecting terminals 14a and the probes 1 are electrically connected via the connecting sheet 2, and a contact resistance is increased as a result of repeated usage, the contact resistance can be recovered by exchanging the connecting sheet. Further, in this embodiment, because the guiding plate 3 is located in positions corresponding to the outer connecting terminals 14a of the semiconductor package, it is possible to improve an accuracy of alignment.

The guiding plate 3 according to this embodiment is aligned using the alignment pin 110b, described in the above-mentioned Embodiment 1. Further, by interposing the connecting sheet 2 and the guide plate 3 between a socket lid 110a and a socket base, slippage caused by contact pressure can be prevented, and further stabilization is obtainable.

Embodiment 7

Figure 10:
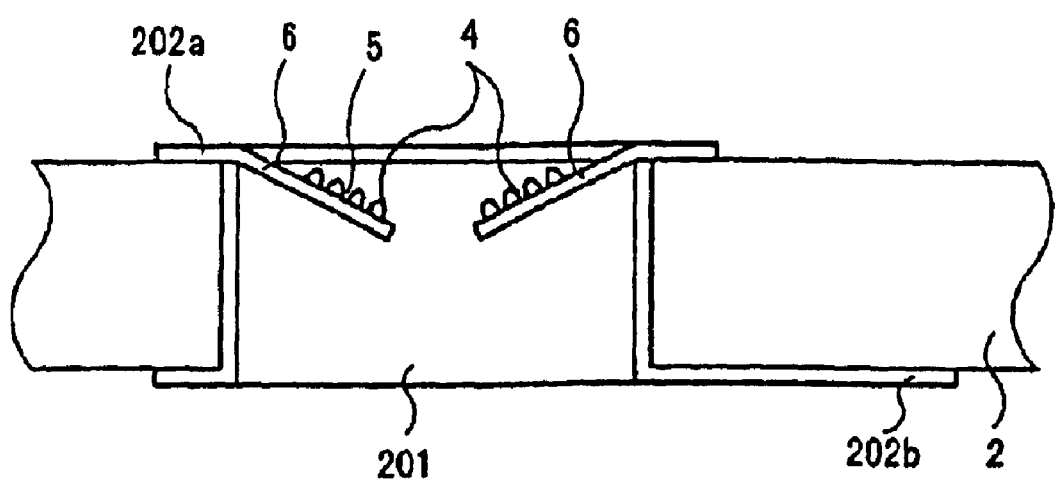
FIG. 10 is a cross-sectional view of a connecting sheet according to Embodiment 7 of the present invention.
Figure 11:
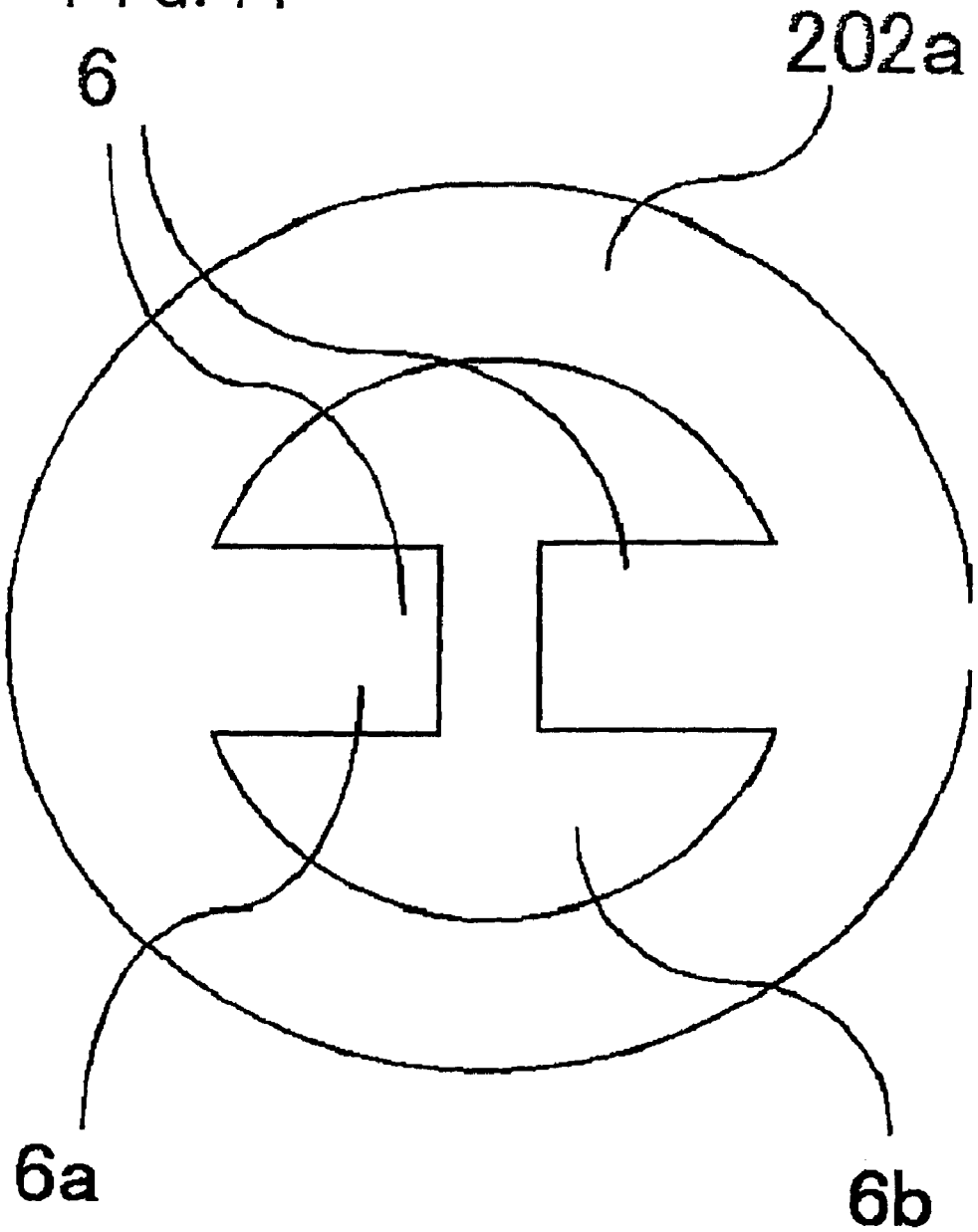
FIG. 11 is a plan view of an electrode of the connecting sheet according to Embodiment 7 of the present invention.

FIG. 10 illustrates a cross-sectional view of a structure of a connecting sheet of a test socket according to Embodiment 7 of the present invention. FIG. 11 is a plan view illustrating a structure of an electrode of the connecting sheet of the test socket according to Embodiment 7 of the present invention. In the figures, numerical reference 2 designates the connecting sheet; numerical reference 4 designates a protrusion, formed into a smooth curved surface; numerical reference 5 designates a recess formed into a smooth curved surface, the recesses extending in the vicinity of the protrusion 4; numerical reference 6 designates a lead; numerical reference 6a designates a bending portion; numerical reference 6b designates a spaced portion; numerical reference 201 designates a connecting hole; numerical references 202a designate an electrode pad, being in contact with an outer connecting terminal 14a; numerical references 202b designates an electrode pad, being in contact with a probe 1 or connected to a connecting wire 203.

In this test socket, the connecting sheet 2 is included. The connecting holes 201 and the electrodes 202b are formed in the connecting sheet 2. Accordingly, in a similar manner to those in Embodiments 1 through 6, the outer connecting terminals 14a are electrically connected with the probes 1 via the connecting sheet 2. When a contact resistance is increased as a result of repeated usage, the contact resistance can be recovered by exchanging the connecting sheet 2. Further, in this embodiment, the leads having the protrusions 4, formed into the smooth curved surfaces and the recesses 5, formed into the smooth curved surfaces and extending in the vicinity of the protrusions 4, are formed in the electrodes 202a, being in contact with the outer connecting terminals 14a of the semiconductor package, wherein the leads 6 include the bending portions 6a and the spaced portions 6b. The connecting sheet 2 is electrically connected with the outer connecting terminals 14a at the bending portions 6a of the leads 6. Because the bending portions 6a are bent when pressure is applied thereto in addition to elastic deformation of the connecting sheet 2, whereby flexibility is improved and follow-up capability against scattering of the height of the outer connecting terminals 14a is improved. Further, because the leads 6 are formed so as not to be in contact with tip portions of the outer connecting terminals 14a, scars, caused by contacts, can be restricted. Because the plurality of protrusions 4, formed by the smooth curved surfaces, in the leads 6 sufficiently supply a contact area. Further, in a similar manner to that in Embodiment 5, since solder debris 30 is accumulated in the recesses 5, which is formed by the smooth curved surfaces and extends in the vicinity of the protrusions 4, a good contact resistance can be maintained.

The leads 6 according to this embodiment are produced by processing shapes of the electrode pads 202a of the connecting sheet 2, having the electrode pads 202a and the connecting holes 201, and bending by applying a load. It is not always necessary to bend and give an angle.

Further, in this embodiment, an example that the leads having two indents have been described. However, the number is not specified.

Embodiment 8

Figure 12:
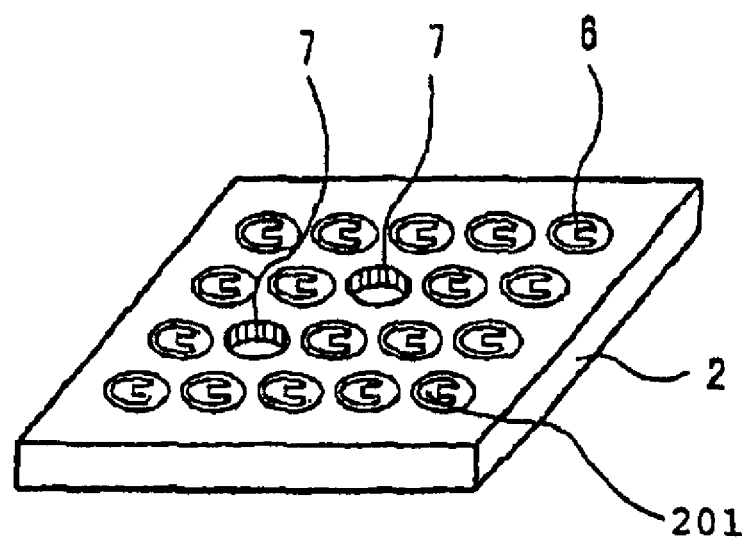
FIG. 12 is a perspective view of a connecting sheet according to Embodiment 8 of the present invention.

FIG. 12 is a perspective view illustrating a structure of a connecting sheet of a test socket according to Embodiment 8 of the present invention. In the figure, numerical reference 2 designates a connecting sheet; numerical reference 201 designates a connecting hole; numerical reference 6 designates a lead; and numerical reference 7 designates a through hole.

The connecting holes 201 are formed in the connecting sheet 2 of the test socket. In a similar manner to those in Embodiment 1 through 7, the outer connecting terminals 14a are electrically connected to the probes 1 through the connecting sheet 2. When a contact resistance is increased as a result of repeated usage, the contact resistance is recovered by exchanging the connecting sheet 2. Further, in this embodiment, the through hole 7 is formed in a part of the connecting sheet to make the probe 1 or the outer connecting terminal 14a penetrate therethrough. Accordingly, the through hole 7 is a mark for aligning a direction when the outer connecting terminals 14a of the semiconductor package are in contact with the connecting sheet, whereby the alignment of the direction becomes easy.

Figure 13:
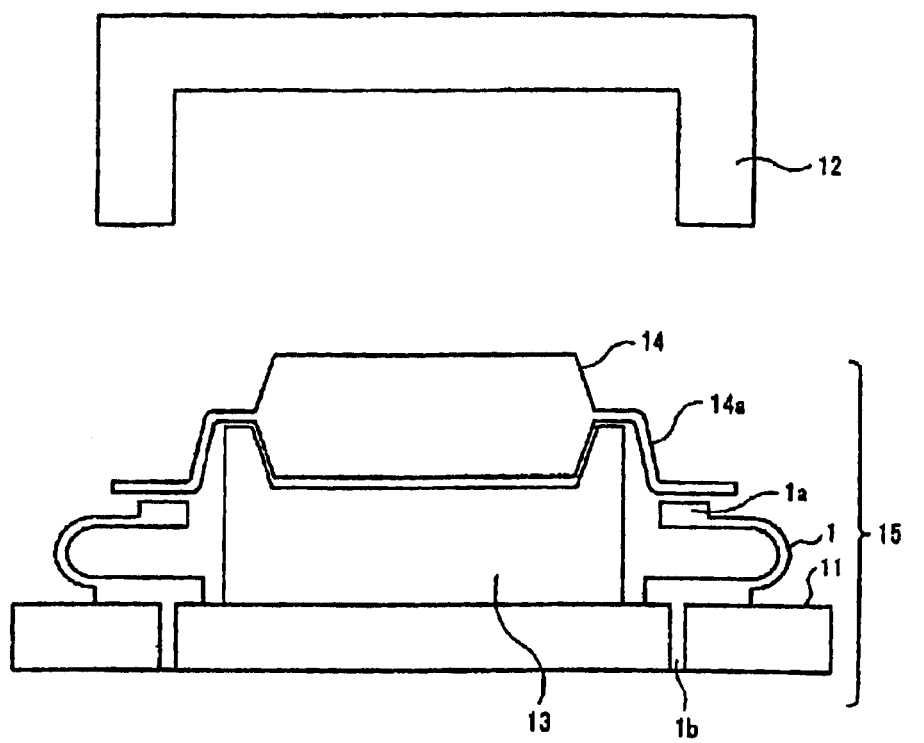
FIG. 13 is a cross-sectional view illustrating a conventional test socket.

Further, by penetrating the probe 1 through the through hole 7 so as to be in agreement with a direction aligning electrode 18 of the semiconductor package illustrated in FIG. 13, usage is further facilitated.

In this embodiment, an example that the leads 6, having a bending portion 6a with respect to a connecting hole 201, has been described. However, the electrodes may be shaped into a plane.

The first advantage according to the present invention is that even though the semiconductor device is repeatedly tested using the test socket, and solder debris on the surfaces of the outer connecting terminals is deposited on the electrode pads to increase a contact resistance, only the connecting sheet is exchanged, and electrical contacting capability can be recovered again. Accordingly, it is not necessary to select and exchange the probes and to exchange a costly socket as a whole, whereby a maintenance cost can be drastically reduced. Further, the base of the connecting sheet is the elastically deformative insulating member, by a bending motion of the insulating member, scattering of the heights of the outer connecting terminals can be absorbed, whereby reliability is improved.

The second advantage according to the present invention is that outer connecting terminals of any shape can be dealt with. There is an effect that an arrangement and a pitch of the electrodes can be changed in use of the connecting wires.

The third advantage according to the present invention is that contacts between the probes and the connecting sheet are secured.

The fourth advantage according to the present invention is that the socket structure is simplified, and a production cost is reduced.

The fifth advantage according to the present invention is that production costs of the test socket and the testing equipment can be reduced.

The sixth advantage according to the present invention is that secure contacts are obtainable, and a good contact resistance can be maintained. Further, since the recesses, formed from the smooth curved surfaces and extending in the vicinity of the protrusions, are located to accumulate solder debris, produced by contacts with the outer connecting terminals, it is possible to prevent a contact resistance from increasing when the recesses are positioned between the outer connecting terminals and the electrodes, whereby a long lifetime of the socket can be demonstrated. Further, since the pressure is small, it is possible to prevent deformation of the outer connecting terminals and conducting a test of increasing a temperature.

The seventh advantage according to the present invention is that an aligning accuracy is improved using the guiding plate.

The eighth advantage according to the present invention is that flexibility of the electrodes is improved and follow-up capability is improved even though scattering of the heights of the outer connecting terminals exists. Further, because the bending portions are not in contact with the tip portions of the outer connecting terminals, there is the effect of suppressing scars, caused by the contacts.

The ninth advantage according to the present invention is that an aligning accuracy is improved by forming the though hole and making the probe penetrate therethrough.

Obviously, numerous modifications and variations of the present invention are possible in light of the above teachings. It is therefore to be understood that within the scope of the appended claims, the invention may be practiced otherwise than as specifically described therein.

The entire disclosure of Japanese Patent Application JP-A-11-294677 filed on Oct. 18, 1999 including specification, claims, drawings and summary are incorporated herein by reference in its entirety.

What is claimed is:

1. A test socket for testing electrical characteristics of a semiconductor device by connecting probes, arranged in a grid-like form, with outer connecting terminals of the semiconductor device, arranged in a grid-like form, and electrically connecting the probes with the outer connecting terminals comprising:

a connecting sheet, made of an elastically deformative insulating material, and having electrodes for electrically connecting the probes to the outer connecting terminals of the semiconductor device wherein a plurality of protrusions, formed into a smooth curved surface, and a plurality of recesses, formed into a smooth curved surface and extending in the vicinity of the protrusions, are formed in the electrodes of the connecting sheet, being in contact with the outer connecting terminals of the semiconductor device.

2. The test socket according to claim 1, wherein the electrodes of the connecting sheet are electrodes being in contact with probes, and electrodes being in contact with the outer connecting terminals of the semiconductor device, and the electrodes include two different types of electrodes which are connected through electrically connecting holes, formed in the elastically deformative insulating member and located on a front surface and a back surface of the connecting sheet.

3. The test socket according to claim 1, wherein a shape of tips of the probes, being in contact with the electrodes of the connecting sheet, is like a recess or a protrusion, and the electrodes are shaped like a protrusion, which can be engage with the probes of the recess-like shape or a recess, which can be engaged with the probes of the protrusion-like shape.

4. The test socket according to claim 1, wherein a through hole is formed in a part of the connecting sheet.

5. A test socket having a circuit board, which transmits an electrical signal for testing electrical characteristics of a semiconductor device to outer connecting terminals of the semiconductor device, arranged in a grid-like form, and receives the electrical signal from the outer connecting terminals, and transmits the electrical signal to a testing equipment and receives the electrical signal from the testing equipment, comprising:

a connecting sheet, made of an elastically deformative insulating member and having electrodes for electrically connecting the circuit board with the outer connecting terminals of the semiconductor device wherein a plurality of protrusions, formed into a smooth curved surface, and a plurality of recesses, formed into a smooth curved surface and extending in the vicinity of the protrusions, are formed in the electrodes of the connecting sheet, being in contact with the outer connecting terminals of the semiconductor device.

6. The test socket according to claim 5, wherein the electrodes of the connecting sheet are electrodes, being in contact with the circuit board, and electrodes, being in contact with the outer connecting terminals of the semiconductor device, the electrodes include two different types of electrodes which are connected through electrically connecting holes, formed in the elastically deformative insulating member, and connecting wires, and are located on a front surface and a back surface of the connecting sheet, and a distance between the electrodes, being in contact with the circuit board, and a distance between the electrodes, being in contact with the outer connecting terminals of the semiconductor device, are different.

7. The test socket according to claim 5, wherein a through hole is formed in a part of the connecting sheet.

8. A connecting sheet included in a test socket for testing electrical characteristics of a semiconductor device by connecting probes, arranged in a grid-like form, with outer connecting terminals of the semiconductor device, arranged in a grid-like form, and electrically connecting the probes with the outer connecting terminals, the connecting sheet comprising:

an elastically deformative insulating material, and having electrodes for electrically connecting the probes to the outer connecting terminals of the semiconductor device wherein a plurality of protrusions, formed into a smooth curved surface, and a plurality of recesses, formed into a smooth curved surface and extending in the vicinity of the protrusions, are formed in the electrodes of the connecting sheet, being in contact with the outer connecting terminals of the semiconductor device.

9. The connecting sheet included in the test socket according to claim 8, wherein the electrodes of the connecting sheet are electrodes being in contact with probes, and electrodes being in contact with the outer connecting terminals of the semiconductor device, and the electrodes include two different types of electrodes which are connected through electrically connecting holes, formed in the elastically deformative insulating member and located on a front surface and a back surface of the connecting sheet.

10. The connecting sheet included in the test socket according to claim 8, wherein a shape of tips of the probes, being in contact with the electrodes of the connecting sheet, is like a recess or a protrusion, and the electrodes are shaped like a protrusion, which can be engage with the probes of the recess-like shape or a recess, which can be engaged with the probes of the protrusion-like shape.

11. A connecting sheet included in a test socket having a circuit board, which transmits an electrical signal for testing electrical characteristics of a semiconductor device to outer connecting terminals of the semiconductor device, arranged in a grid-like form, and receives the electrical signal from the outer connecting terminals, and transmits the electrical signal to a testing equipment and receives the electrical signal from the testing equipment, the connecting sheet comprising:

an elastically deformative insulating member and having electrodes for electrically connecting the circuit board with the outer connecting terminals of the semiconductor device wherein a plurality of protrusions, formed into a smooth curved surface, and a plurality of recesses, formed into a smooth curved surface and extending in the vicinity of the protrusions, are formed in the electrodes of the connecting sheet, being in contact with the outer connecting terminals of the semiconductor device.

12. The connecting sheet included in the test socket according to claim 11, wherein the electrodes of the connecting sheet are electrodes, being in contact with the circuit board, and electrodes, being in contact with the outer connecting terminals of the semiconductor device, the electrodes include two different types of electrodes which are connected through electrically connecting holes, formed in the elastically deformative insulating member, and connecting wires, and are located on a front surface and a back surface of the connecting sheet, and a distance between the electrodes, being in contact with the circuit board, and a distance between the electrodes, being in contact with the outer connecting terminals of the semiconductor device, are different.

* * * * *